United States Patent [19]
Lee et al.

[11] Patent Number: 5,800,906
[45] Date of Patent: Sep. 1, 1998

[54] LABEL FOR SEMICONDUCTOR WAFER

[75] Inventors: Jae-sung Lee; Jin-pyo Lee; Nam-cheol Kim; Seong-won Lee, all of Suwon, Rep. of Korea

[73] Assignee: Samsung Electronics Co., Ltd., Suwon, Rep. of Korea

[21] Appl. No.: 755,158

[22] Filed: Nov. 22, 1996

[30] Foreign Application Priority Data

Nov. 30, 1995 [KR] Rep. of Korea .................. 95-45823

[51] Int. Cl.$^6$ .................................................. B32B 23/02
[52] U.S. Cl. .................. 428/192; 428/131; 428/212; 428/156
[58] Field of Search .......................... 428/167, 192, 428/81, 131, 212, 156; 283/81

[56] References Cited

U.S. PATENT DOCUMENTS 3,896,247  7/1975  Desoléve et al. .................. 428/136

FOREIGN PATENT DOCUMENTS

| | | |
|---|---|---|
| 0311087 A2 | 10/1988 | European Pat. Off. . |
| 0604061 | 12/1993 | European Pat. Off. . |
| 0604061 A1 | 12/1993 | European Pat. Off. . |
| 55-72034 | 5/1980 | Japan . |
| 61-196512 | 8/1986 | Japan . |
| 2-183509 | 7/1990 | Japan . |

*Primary Examiner*—Donald Loney
*Attorney, Agent, or Firm*—Jones & Volentine, L.L.P.

[57] ABSTRACT

A semiconductor wafer label for identifying a wafer includes at least one concave mark formed on an edge of a flat zone of each wafer. The label may include one or more concave marks having a first width and first length and one or more concave marks having a second width and a second length. Accordingly, it is not necessary to take the wafer out of a wafer cassette in order to read the wafer number, thereby reducing contamination and damage to the wafer.

14 Claims, 3 Drawing Sheets

LABEL FOR SEMICONDUCTOR WAFER

BACKGROUND OF THE INVENTION

1. Field of the Invention

The present invention relates to a label for a semiconductor wafer for identifying different types of semiconductor wafers in a wafer cassette.

2. Description of the Related Art

It is essential to form a specific label on a predetermined region of a semiconductor wafer [hereinafter referred to simply as a wafer] in order to correctly identify a wafer to be used for manufacturing a semiconductor device. The label is usually marked with predetermined alphanumeric characters on an edge surface of the wafer, using photolithography or laser etching.

In general, a plurality of wafers constituting a lot are stored in one or two wafer cassettes. The inside of the wafer cassette includes a plurality of slots adjacent to each other, where wafers are inserted. The interval between the wafers in such a cassette is very small. Thus, it is difficult to read labels formed on a surface of each wafer when they are stored in the wafer cassette. Accordingly, in order to find a predetermined wafer, it is necessary to take wafers out of the wafer cassette using tweezers and then read the label marked on the wafer surface. Here, when a wafer is removed from the wafer cassette using tweezers, the surfaces of wafers adjacent to the wafer being removed may be scratched, thereby greatly contaminating the wafer.

FIG. 1 is a top view showing a wafer on which a conventional label is formed.

As shown in FIG. 1, a label 3 formed on the surface of the flat zone of a wafer 1 is marked with alphanumeric characters for identifying the wafer 1. In general, the label includes the alphanumeric characters representing a type of semiconductor device, a lot number and a serial number of the wafer.

However, since the conventional label is formed on the surface of the flat zone of a wafer, it is impossible to read the label from the side. In order to search for a predetermined wafer from a plurality of wafers in the wafer cassette, several sheets of wafers are removed therefrom to check the label, which causes scratches on the surface of adjacent wafers. The scratches formed on the wafer surface generate contamination particles, thereby reducing yield.

SUMMARY OF THE INVENTION

Accordingly, it is an object of the present invention to provide a label for a semiconductor wafer for identifying wafers without taking them from a wafer cassette.

To accomplish this and other objects of the present invention, there is provided a semiconductor wafer label for identifying wafers used for manufacturing a semiconductor device, wherein the label comprises at least one concave mark formed on an edge of a flat zone of each wafer.

The label may further comprise at least one other mark, having a width or length different than the first concave mark.

It is further preferable that a lot number and wafer number represented by alphanumeric characters be formed on a surface of the region adjacent to said mark.

According to the label for a semiconductor wafer of the present invention, unnecessary contact with wafers is reduced, thereby preventing contamination and damage to the wafer.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
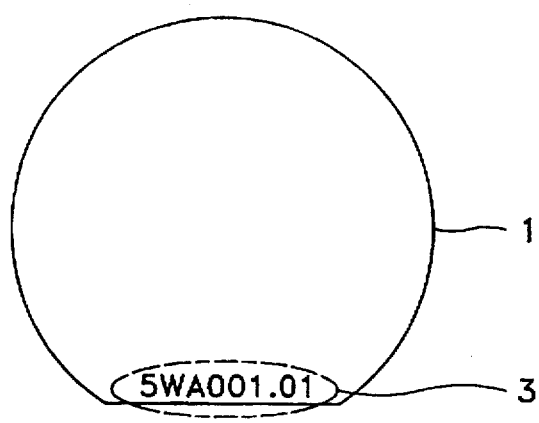
FIG. 1 is a top view showing a wafer having a conventional label formed thereon.
Figure 2:
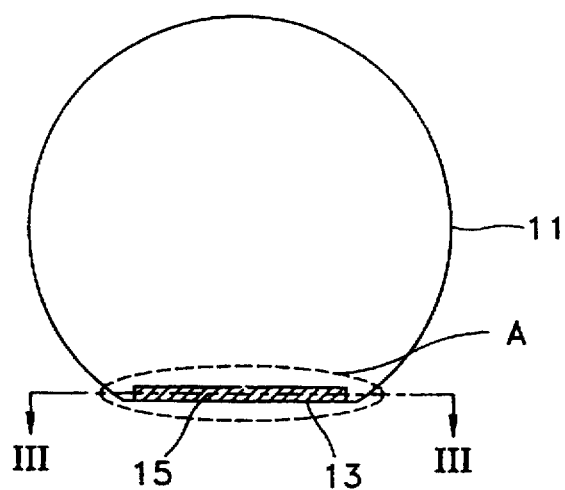
FIG. 2 is a top view of a wafer illustrating a label according to the present invention.
Figure 3:
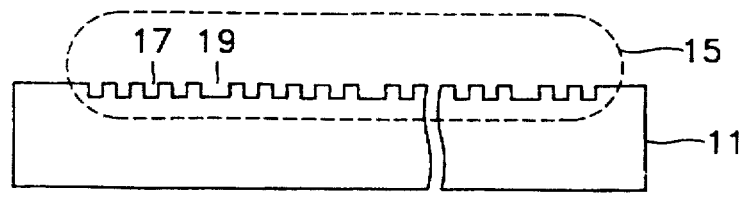
FIG. 3 is a sectional view taken along line 3'—3' of FIG. 2.
Figure 4:
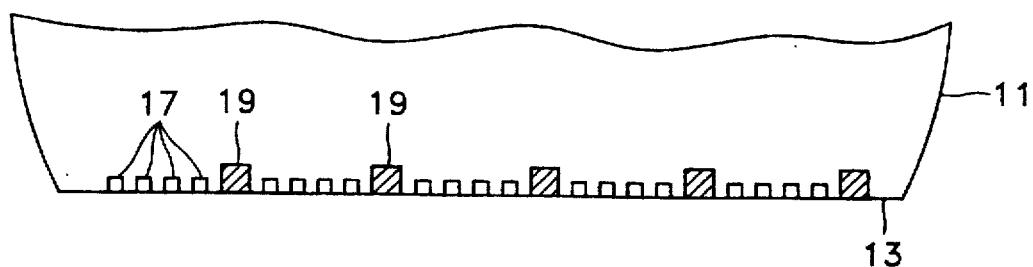
FIG. 4 is an enlarged top view of portion A of FIG. 2.

Referring to FIGS. 2, 3 and 4, reference numeral 11 denotes a wafer, reference character A denotes a flat zone of the wafer 11, reference numeral 13 denotes an edge of the flat zone A of the wafer 11, and reference numeral 15 denotes a label formed on the surface of the wafer 11 contacting the edge 13 of the flat zone A. Here, as shown in FIG. 3, the surface of the label 15 is formed with a plurality of concavities.

The concavities of the label 15 are formed using photolithography or laser etching as in the conventional method. As shown in FIGS. 3 and 4, preferably, the concavities of the label 15 are comprised of a first mark 17 having a predetermined width and a second mark 19 having a width wider than that of the first mark 17.

Figure 5:
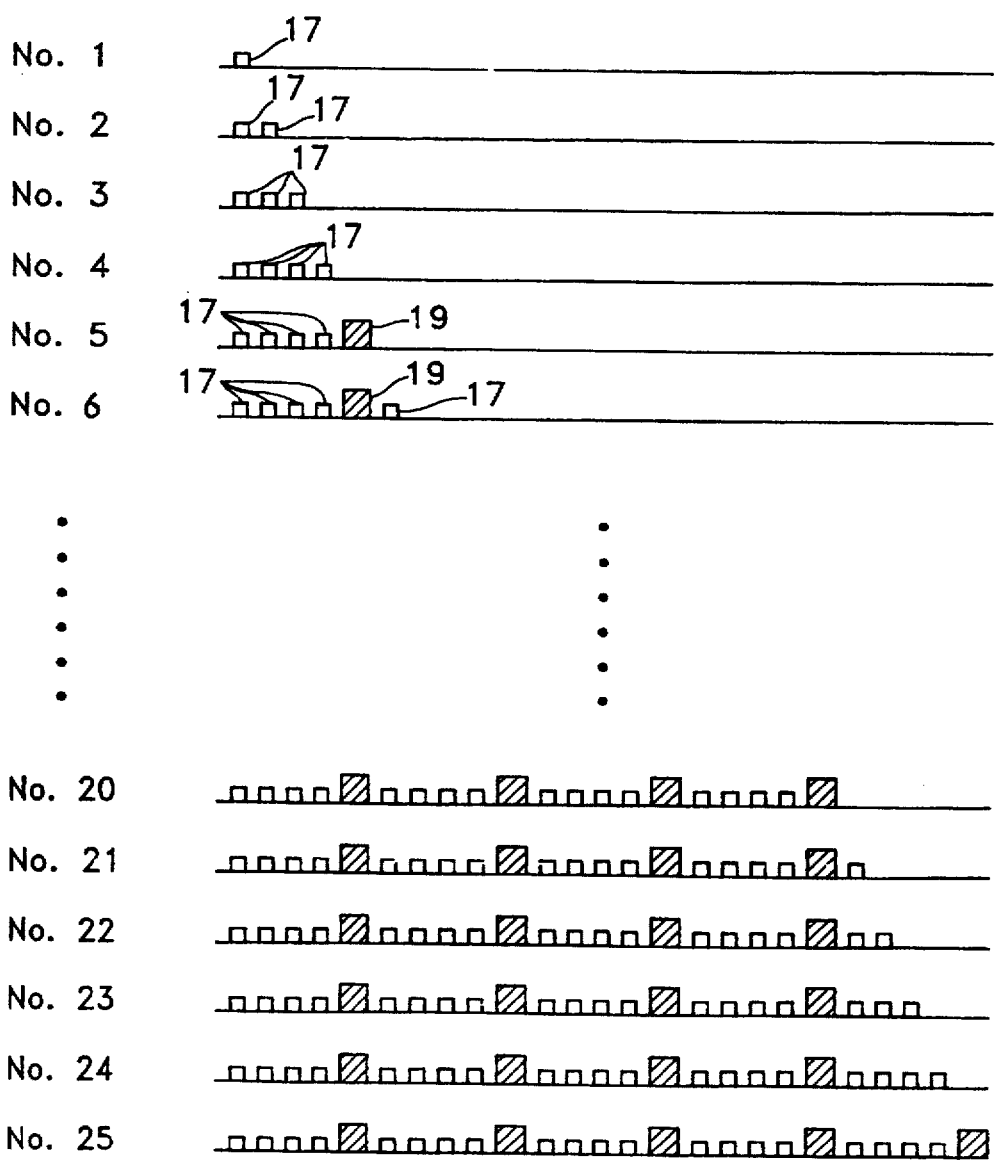
FIG. 5 is a partial top view illustrating a method for producing a label on a wafer using first and second marks shown in FIG. 4.
Figure 6:
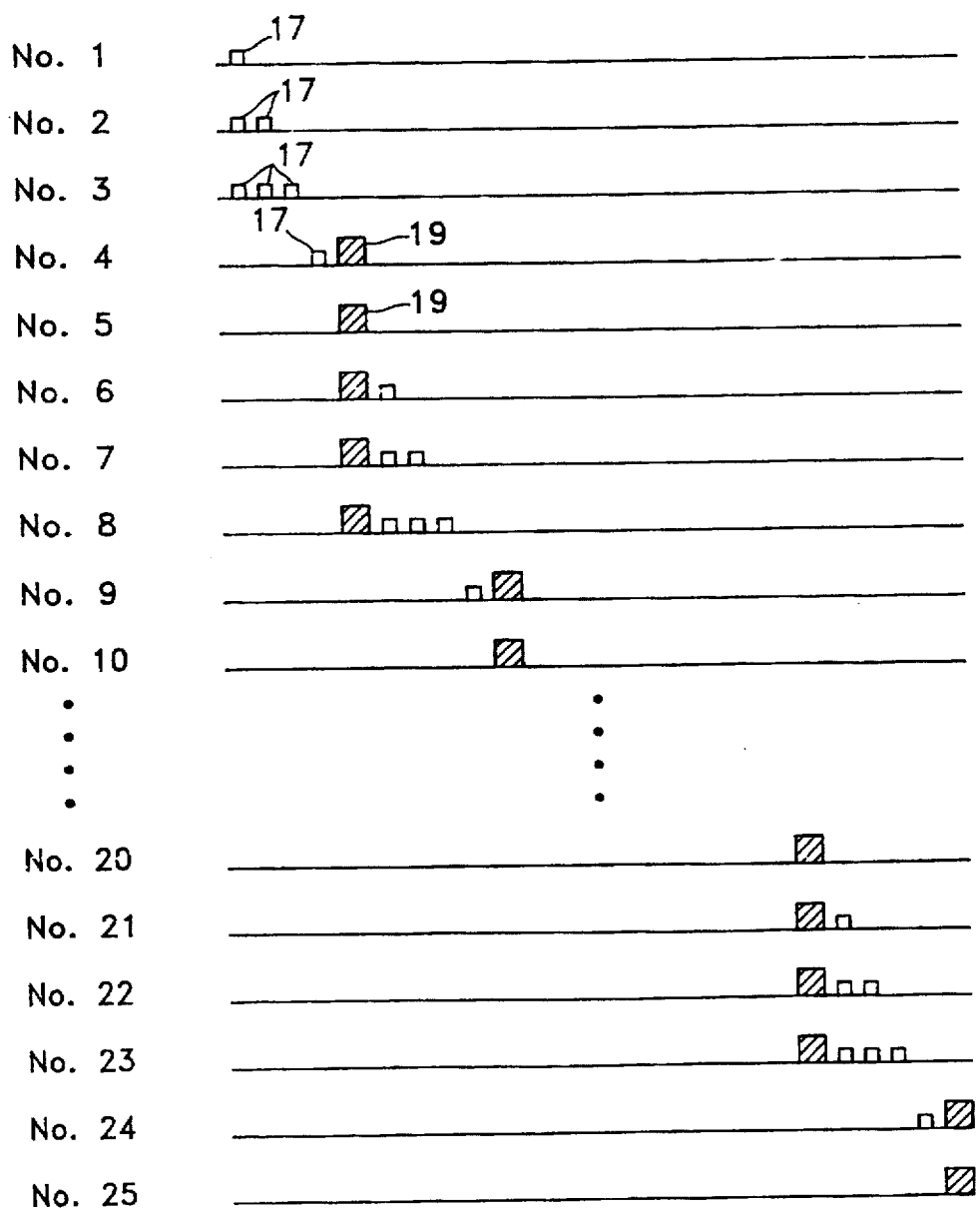
FIG. 6 is a partial top view illustrating another method for producing a label on a wafer using first and second marks shown in FIG. 4.

As described further with regard to FIGS. 5 and 6, since the number of first marks used in the present label is greater than the number of second marks, a first mark having a smaller width requires less space for the label. It is understood, however, that the present invention may include a label 15 having a first mark 17 that is wider than the second mark 19.

When the label 15 is formed in this way, it can be read when wafers 11 are arranged in a wafer cassette with the flat zones thereof facing upward. Accordingly, it is easy to read each wafer 11 without taking it out of the wafer cassette.

Referring to FIG. 5, for example, in the case where a lot consists of twenty-five wafers, a first wafer is indicated by a label composed of one first mark 17 formed at the left end of the edge of the flat zone thereof. A second wafer is indicated by a label composed of two first marks 17 arranged at the left end of the edge of the flat zone. By the same method as mentioned above, a fifth wafer is indicated by a label composed of four first marks 17 and one second mark 19, which are sequentially arranged on the edge of the flat zone. Consequently, when wafer labels are represented using the above-mentioned method, it is possible to easily identify all the wafers constituting a lot.

Referring to FIG. 6, using the same example of a lot composed of twenty-five wafers as shown in FIG. 5, a first wafer is indicated by a label composed of one first mark 17 formed at the left end of the edge of the flat zone thereof. The second and third wafers are indicated by labels composed of two and three first marks 17, respectively, arranged on the left end of the edge of the flat zone. Also, a fourth wafer is indicated by a label composed of one first mark 17, formed at the left end of the edge of the flat zone in a position corresponding to three intervals between the adjacent first marks 17, and one second mark 19 formed to the right of the first mark 17. A fifth wafer is indicated by a label composed of one second mark 19. Using the above-mentioned method, all the wafers in a lot can be easily identified.

While the widths of the first and second marks are different in the x-direction (see FIG. 4), the lengths of the first and second marks may also be different in the y-direction, although they need not be. It is understood that any combination of lengths and widths of the first and second marks may be utilized to provide distinguishing concavities for the label. As shown in FIGS. 4–6, for example, the first mark has a first length in the y-direction and the second mark has a second different length in the y-direction.

Also, as shown in FIG. 6, each wafer may be more easily identified with an identification ID 40, composed of alphanumeric characters in the same way as in the conventional method, formed on a region adjacent to the label 15.

According to the present invention, a label of each wafer can be read without taking the wafers out of a wafer cassette. Therefore, since tweezers are not required for reading the number of a predetermined wafer, the surface of the wafer will not be scratched, thereby preventing contamination and damage to the wafer.

It should be understood that the invention is not limited to the illustrated embodiment and many changes and modifications can be made within the scope of the invention by a person skilled in the art.

What is claimed is:

1. A label for identifying a semiconductor wafer during manufacture, wherein said semiconductor wafer comprises a flat zone formed on an edge portion of the semiconductor wafer, the label comprising: at least one first concave mark formed in the flat zone, wherein the first concave mark is readily identifiable to the human eye.

2. A semiconductor wafer label according to claim 1, wherein said at least one first concave mark has a first width and a first length.

3. A semiconductor wafer label according to claim 2, further comprising at least one second concave mark having a second width and a second length.

4. A semiconductor wafer label according to claim 3, wherein said second width is greater than said first width, and said first and second lengths are equal.

5. A semiconductor wafer label according to claim 3, wherein said second width is greater than said first width, and said first length is greater than said second length.

6. A semiconductor wafer label according to claim 3, wherein said second width is greater than said first width, and said second length is greater than said first length.

7. A semiconductor wafer label according to claim 3, wherein said first width is greater than said second width, and said first and second lengths are equal.

8. A semiconductor wafer label according to claim 3, wherein said first width is greater than said second width, and said first length is greater than said second length.

9. A semiconductor wafer label according to claim 3, wherein said first width is greater than said second width, and said second length is greater than said first length.

10. A semiconductor wafer label according to claim 1 further comprising another label adjacent to said mark, said another label having a lot number and wafer number.

11. A label for visually identifying a semiconductor wafer during manufacture, wherein the wafer comprises a flat zone formed on an edge portion of the semiconductor wafer, the flat zone having a defined lateral width, and the label comprising: at least one mark selected from a group consisting of a first concave mark having a first width and a second concave mark having a second width different from the first width.

12. A semiconductor wafer label according to claim 11, wherein said at least one mark is placed at a selected position along the lateral width of the flat zone, such that the relation of said at least one mark with said selected position defines the label.

13. A label for visually identifying a semiconductor wafer during manufacture, wherein the wafer comprises a flat zone formed on an edge portion of the semiconductor wafer, the flat zone having a defined lateral width, and the label comprising: a unique combination of at least one first concave mark having a first width and at least one second concave mark having a second width different from the first width.

14. A semiconductor wafer label according to claim 13, wherein said unique combination is placed in a selected position along the lateral width of the flat zone, such that the relation of said unique combination with the selected position defines the label.

* * * * *